United States Patent [19]

Adamski

[11] Patent Number: 4,764,350

[45] Date of Patent: Aug. 16, 1988

[54] METHOD AND APPARATUS FOR SYNTHESIZING A SINGLE CRYSTAL OF INDIUM PHOSPHIDE

[75] Inventor: Joseph A. Adamski, Framingham, Mass.

[73] Assignee: The United States of America as represented by the Secretary of the Air Force, Washington, D.C.

[21] Appl. No.: 916,963

[22] Filed: Oct. 8, 1986

[51] Int. Cl.⁴ ............................................. C30B 35/00
[52] U.S. Cl. ................................. 422/245; 156/616.2
[58] Field of Search ............... 156/616 R, 616 A, 624, 156/DIG. 70; 422/245, 247, 254; 164/122.1, 122.2, 254

[56] References Cited

U.S. PATENT DOCUMENTS

| | | | |
|---|---|---|---|
| 3,060,065 | 10/1962 | Orem | 148/1.6 |
| 3,139,653 | 7/1964 | Orem | 22/57 |
| 3,427,211 | 2/1969 | Foster et al. | 422/245 |
| 3,519,399 | 7/1970 | Kyle | 23/294 |
| 3,623,905 | 11/1971 | Akai et al. | 156/DIG. 70 |
| 3,632,431 | 1/1972 | Andre et al. | 117/201 |
| 3,762,943 | 10/1973 | Winstel et al. | 422/245 |
| 3,767,473 | 10/1973 | Ayel et al. | 156/616 A |
| 3,796,548 | 3/1974 | Boss et al. | 156/616 R |
| 3,810,794 | 5/1974 | Antypas et al. | 148/172 |
| 3,877,883 | 4/1975 | Berkman et al. | 23/301 SP |
| 3,966,881 | 6/1976 | Ayabe | 156/616 A |
| 4,172,756 | 10/1979 | Hollan | 156/614 |
| 4,196,171 | 4/1980 | Watanabe et al. | 422/246 |
| 4,273,608 | 6/1981 | Kerlin | 156/605 |
| 4,559,217 | 12/1985 | Adamski | 423/299 |

OTHER PUBLICATIONS

Adamski, J., "Synthesis of Indium Phosphide", J. Crys. Growth, 64 (1983), 1-9.
Streetman, B. G., Solid State Electronic Devices, Prentice-Hall, 2nd ed., pp. 14-15.
Adamski, J. A., High Purity Polycrystalline InP, Journal of Crystal Growth, vol. 60, No. 1, pp. 141-143 (1982).

*Primary Examiner*—John Doll
*Assistant Examiner*—R. Bruce Breneman
*Attorney, Agent, or Firm*—Stanton E. Collier; Donald J. Singer

[57] ABSTRACT

A method for synthesizing and growing a single crystal of indium phosphide includes vacuum baking and purifying of elemental indium prior to reacting it with red phosphorus within the same apparatus. The steps growth take place in a vertical apparatus by placing the reaction components within a reaction vessel that is sealed under vacuum after the purification and then heated and cooled within predetermined temperature limits to react indium with red phosphorus to synthesize molten indium phosphide and a single crystal of indium phosphide by cooling the molten indium phosphide within a controlled temperature atmosphere. Excess phosphorus is maintained during growth to eliminate the need for encapsulation of the growth melt.

2 Claims, 1 Drawing Sheet

METHOD AND APPARATUS FOR SYNTHESIZING A SINGLE CRYSTAL OF INDIUM PHOSPHIDE

STATEMENT OF GOVERNMENT INTEREST

The invention described herein may be manufactured and used by or for the Government for governmental purposes without the payment of any royalty thereon.

BACKGROUND OF THE INVENTION

This invention relates in general to the synthesis of semiconductor crystals. In a more particular aspect, this invention concerns itself with a method and apparatus for synthesizing highly pure, single crystal, indium phosphide (InP)

Highly pure, single crystal InP, as well as other III-V semiconductor compounds has become an important semiconductor material for a wide variety of technical applications. InP crystals, in particular, are especially important for use as structural materials in the fabrication of substrates used for lattice-matched fiber-optic sources and detectors, high speed integrated circuits, and high frequency microwave devices. Its large band gap (1.35 eV) and high electron mobility make it especially desirable for use as a semiconductor material, especially when employed in its highly pure form. It also finds use as a crystalline substrate for device fabrication by epitaxial deposition techniques. Unfortunately, however, it is extremely difficult to grow single crystals of InP having the high degree of purity necessary for its successful utilization as a thin film device.

A number of methods have been suggested heretofore for synthesizing crystalline InP. One method for synthesizing fairly large ingots involves the direct reaction of elemental phosphorus with elemental indium. The as-supplied products have undesirable impurities therein and must be baked before reaction. In situ-baking of these products has been accomplished in a growth apparatus where polycrystalline indium phosphide is grown. The polycrystalline product is used in the liquid encapsulated Czochralski technique to produce single crystals. During the growth of the single crystal, a layer of $B_2O_3$ must be applied over the growth melt so that the phosphorous is prevented from escaping and thus changing the proportions in the subsequent formation as the crystal develops.

A well known method which has proven somewhat successful in growing single crystals of InP is the so-called Bridgman technique. In this technique, a single crystal ingot of InP is grown from solution by heating the polycrystalline growing materials (elemental indium phosphorus) to a temperature above their melting point, allowing the melt to cool, and, in some manner, restricting nucleation of the solid phase to a single event. In so doing, a single grain is propagated behind a liquid/solid moving interface and, when the interface has traversed the length of the melt, a single crystal remains. This is the basis of the Bridgman technique. The technique can be carried out in a horizontal arrangement or in a vertical arrangement.

In the vertical arrangement, the molten material can be made to solidify by either lowering the crucible through a heat zone, moving the heat zone, or progressively lowering the furnace temperature. In this way, the molten material is made to solidify from the lower end of the crucible. The method suffers limitations in the growth of refractory metal crystals because of the lack of suitable crucible materials. The technique does offer advantages, however, which merit consideration. Bridgman crucibles are obtainable as standard products in a variety of sizes and materials, and the Bridgman technique is capable of producing a wide size-range of crystals from thin rods to ingots several centimeters in diameter. The shape of the crucible is selectable and the standard commercial product has obviously evolved to accommodate practical scientific requirements and economical manufacturing techniques. The Bridgman crucible is usually a tube of circular cross-section with a sharp point formed at the closed end. The bore of the crucible may be parallel or slightly tapered towards the closed end. While the sharp end is not essential, it does enhance the likelihood of point nucleation. The pointed end leads through the temperature gradient defining the effective change from the liquid to solid, and it is here that the single nucleation event is required in order to grow a single grain through the rest of the material as it solidifies. A seed may also be placed in the pointed end to provide a desired orientation.

SUMMARY OF THE INVENTION

The present invention overcomes the problem noted above by providing a rotatable growth furnace that provides for purification and crystal growth.

The apparatus includes a furnace having, in order, an indium furnace, a heat insulating section, and a phosphorus furnace; inside the furnace is a quartz ampoule having, in order, a capillary section, an indium section, a tube connected to the indium section, a phosphorus section having the other end of the tube connected thereto, a neck extending into the phosphorus section, and a tube for inputting the materials and connecting to a vacuum source, and a moveable insulating section positioned between the indium section and the phosphorus section, and a means for rotating the furnace to the vertical position.

The method of using the apparatus includes loading the ampoule with the elemental indium and with a sufficient amount of elemental phosphorus to maintain an overpressure during indium phosphide growth, placing a vacuum on the ampoule, heating the indium to remove impurities, cooling the indium melt, sealing the ampoule under vacuum, heating selectively the indium and phosphorus, allowing the phosphorus gas to react with the indium, rotating the ampoule and furnace to the vertical position, maintaining a phosphorus overpressure, lowering the ampoule to allow crystallization to take place in the InP melt.

It is therefore one object of the present invention to provide a crystal growth furnace that purifies the starting materials and grows crystals within a single apparatus;

It is another object of the present invention to provide a crystal furnace that purifies in a horizontal position and grows a crystal in the vertical position;

It is another object of the present invention to provide a crystal furnace wherein purification and melt formation occur in the horizontal position;

It is another object of the present invention to provide an ampoule for use in the crystal furnace having two connected sections without a boat therein;

It is another object of the present invention to provide a crystal growth apparatus wherein the growth melt is not liquid encapsulated.

These and many other objects and advantages of the present invention will be readily apparent to one skilled in the pertinent art from the following detailed description of a preferred embodiment of the invention and the related drawings.

DETAILED DESCRIPTION OF THE PREFERRED EMBODIMENT

Figure 1:
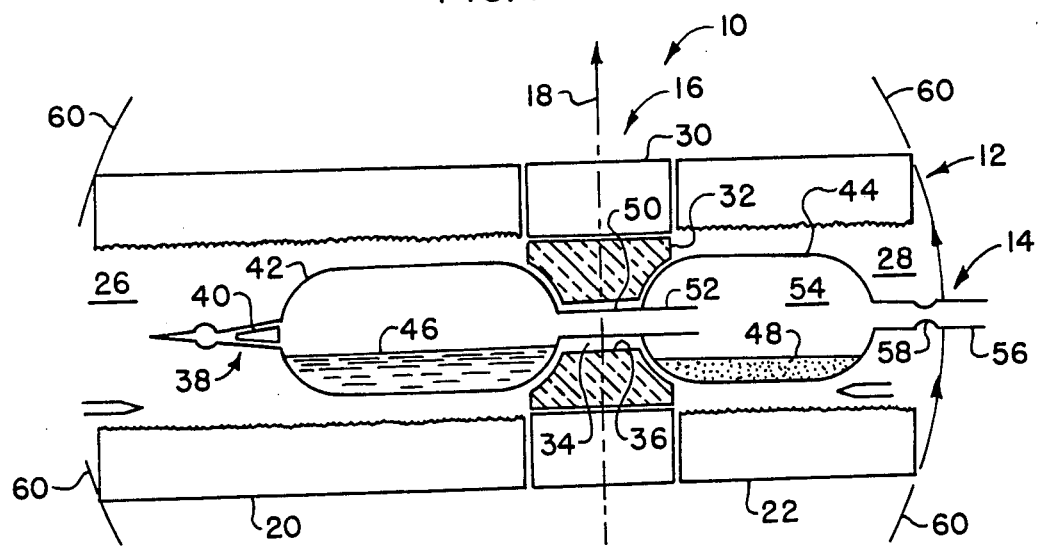
FIG. 1 illustrates a crystal growth apparatus of the present invention wherein the ampoule is in the horizontal position.

Referring to FIG. 1, a crystal growth apparatus 10 is shown having a furnace 12, an ampoule 14, an insulating section 16 and a moveable insulating section 32. A vacuum source, an electrical power source, and rotating means are not shown and considered conventional. The vertical position is defined by line 18.

Figure 3:
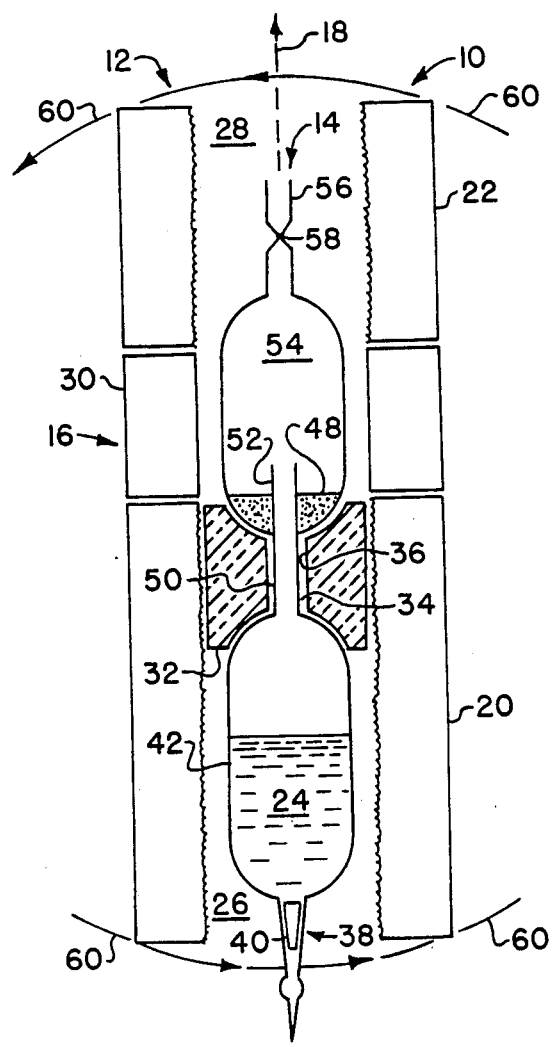
FIG. 3 illustrates a crystal growth apparatus of the present invention wherein the ampoule is being lowered to cause crystal growth.

Furnace 12 is an inductive or resistive heating device but other types are equally usable. Furnace 12 has a first furnace 20 and a second furnace 22. During purification, indium 46 is in first furnace 20 and phosphorus 48 is in second furnace 22. Although indium and phosphorus are specifically mentioned other semiconductor materials are possible where disassociation of a growth melt 24, FIG. 3, is a problem.

Electrical power is applied independently to each furnace so that temperature can be controlled therein. Temperature monitoring means is not shown therein but is normally a thermocouple with associated electronics.

In order to maintain separate heating zones, first and second heating zones 26 and 28, respectively, insulating sections 16 and 32 are placed between furnaces 20 and 22. Moveable insulating section 32 closely fits within furnaces 20 and 22 and has therein a cavity 34 defined by cavity wall 36 that also closely fits about ampoule 14 such that little heat is transferred across cavity 34 and ampoule 14 is fixedly held therein.

Figure 2:
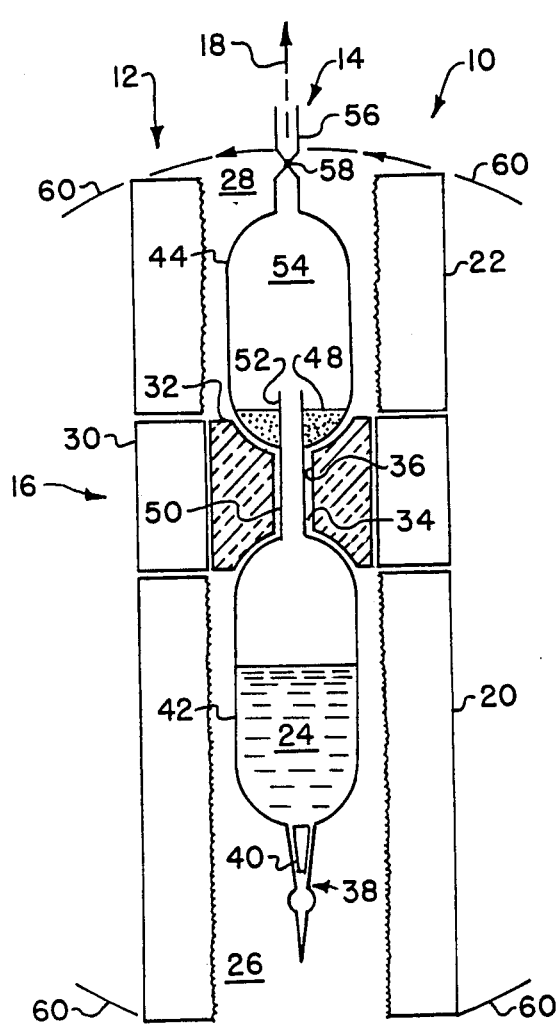
FIG. 2 illustrates a crystal growth apparatus of the present invention as in FIG. 1 but the ampoule is rotated to the vertical position to initiate crystal growth.

Ampoule 14 is made of quartz and must be able to withstand an internal pressure of about 5 to 28 atmospheres. Ampoule 14 has a capillary section 38 wherein crystallization starts, and a seed 40 may be placed therein to orient a crystal to be grown. Ampoule 14 has a melt section 42 which in this embodiment contains elemental indium 46 and a vapor phase section 44 which is filled with elemental phosphorus 48. Sections 42 and 44 are connected together by a tube 50 which has a neck 52 that extends substantially into a cavity 54 of section 44. Neck 52 prevents a phosphorus 48 from spilling into indium 48 when ampoule 14 is rotated to the vertical position 18 and also is provided with such a length so that excess phosphorus 48 can be placed therein so that an overpressure of phosphorus vapor is maintained during single crystal growth to prevent the disassociation of phosphorus from the indium phospide melt 24. A port tube 56 is attached to section 44 and opposite to tube 50. Port tube 56 is used for loading the materials into ampoule 14 and is used for establishing a vacuum in ampoule 14. To hold a vacuum therein a sealing section 58 on port tube 56 is closed as shown in FIGS. 2 and 3.

Attaching means, not shown can also be placed on port tube 56 so that ampoule 14 can be transported about furnace 12 in a desired manner to grow a crystal in capillary section 38.

A rotating means is indicated schematically by lines 60.

In carrying out the method of the present invention, elemental indium 46 is placed in melt section 42 and red phosphorus 48 is placed in vapor phase section 44. The ampoule is inserted into movable insulating section 32 and then placed into two zone furnace 10 being in the horizontal position as shown in FIG. 1. The port tube 56 is connected to a vacuum source, not shown. The ampoule 14 is then evacuated to a pressure of about $1 \times 10^{-3}$ Torr while simultaneously heating melt section 42 to a temperature of about 850° C. for about 6 hours to purify the elemental indium 46. At the same time vapor phase section 44 is maintained at room temperature by second furnace 22. The temperature difference between sections 42 and 44 is maintained because of insulating sections 30 and 32 positioned between furnaces 20 and 22. After vacuum baking has been completed, first furnace 26 is turned off and the baked indium is allowed to cool at its own rate to room temperature. While maintaining the desired vacuum of about $1 \times 10^{-7}$ Torr, the port tube 56 is sealed by sealing section 58 to maintain a vacuum and closed system. Next, the indium is heated to a temperature of about 1000°–1080° C. While the indium 46 is at this range, second furnace 22 is turned on and, depending on the phosphorus pressure desired, the temperature of vapor phase section 44 is increased from about 450° C. to 550° C. The integrity of the quartz ampoule 14 must be such as to withstand the internal vapor pressure of the phosphorus 48 which amounts to about 5 to 28 atmospheres at 450° C. to 550° C. At these pressures most of phosphorus 48 vaporizes and flows through necks 52 and tube 50 into melt section 42 to react with the indium 46 to form a melt 24 of indium phosphide. Once the reaction is completed, furnace 12 and ampoule 14 are rotated 90° as shown in FIG. 2 and the liquid melt 24 of indium phosphide will flow to the bottom and into the capillary section 38. Now that the liquid melt 24 seeks its own level in a vertical position ampoule 14 is then retracted downwardly, FIG. 3, to cool and crystallize the InP contained in capillary section 38 and the bottom portion of ampoule melt section 42. As in InP crystallizes, a single crystal of InP will form during withdrawal in the capillary sectin 38 and then single crystal growth continues into the bottom portion of melt section 42 as a single crystal of InP. Crystal growth continues in ampoule 14 until the liquid has completely solidified. Stoichiometry is achieved in this method by maintaining excess phosphorus 48 in section 44 as shown in FIG. 2. The phosphorus 48 is maintained in section 44 by reason of neck 52 as noted above. If desired, a crystal seed 40 may be placed within the capillary section 38 to initiate single crystal growth of any predetermined crystallographical orientation. Synthesis and crystal growth are both accomplished by the same ampoule in a contaminant free, closed environment in a continuing process without the necessity of separating the synthesis and growth techniques as took place heretofore.

Clearly, many modifications and variations of the present invention are possible in light of the above teachings and it is therefore understood, that within the inventive scope of the inventive concept, the invention may be practiced otherwise than specifically claimed.

What is claimed is:

1. A crystal growth apparatus, said apparatus comprising:

a furnace, said furnace having a first furnace section and a second furnace section, said first and said second furnace sections being independently heatable and having a longitudinal cavity therethrough, said furnace having a first heating zone and second heating zone in said cavity, said first heating zone being within said first furnace section and said second heating zone being within said second heating section, an insulating section, said insulating section having a fixed insulating section and a moveable insulating section, said fixed insulating section having a longitudinal cavity therethrough and being in between said heating sections, said moveable insulating section fitting closely within said longitudinal cavities of said furnace sections and said fixed insulating section and having an ampoule cavity therethrough, said ampoule cavity being centered in said furnace;

an ampoule, said ampoule having a longitudinal length greater than its width, said ampoule having a capillary section, a melt section, a vapor phase section and a connecting tube between said melt section and said vapor phase section; a neck, said neck attached to said connecting tube and inserted into said vapor phase section; and a port tube; said capillary section being attached to a longitudinal end of said melt section opposite to said connecting tube; said capillary section having no melt therein when said ampoule is horizontally positioned, said capillary section being the location where nucleation of a single crystal starts, said connecting tube providing a communicating channel between said melt section and said vapor phase section, said connecting tube being closely held within said ampoule cavity of said moveable insulating section, said neck extending into said vapor phase section for preventing the flow of non-vapor material into said melt section when said ampoule is positioned in a vertical position, said neck having a length greater than the depth of said non-vapor material surrounding said neck when said ampoule is in said vertical position, said port tube having a sealable section therein to seal a vacuum in said ampoule, said port tube being attached to a longitudinal end of said vapor section and opposite said neck, said port tube being connected to a vacuum source before sealing;

means for rotating said ampoule to said vertical position while within said furnace;

means for translating said ampoule within said furnace to control the growth of said single crystal therein; means for measuring temperature within said heating zones; and means for providing electrical power to said furnace.

2. A crystal growth apparatus as defined in claim 1 wherein said moveable insuating section has a central ampoule cavity therein having an hour glass shape conforming to ends of said melt section and said vapor section and to the connecting tube therebetween, said moveable insulating section partially covering said ends, said moveable insulating section having an exterior wall being in close proximity to interior walls of said fixed insulating section and said furnace whereby the flow of heat outside said amounts is prevented between said heating zones.

* * * * *